United States Patent
Schatz et al.

(10) Patent No.: US 9,316,703 B2
(45) Date of Patent: Apr. 19, 2016

(54) APPARATUS AND METHOD FOR MEASURING MAGNETIC FIELDS

(75) Inventors: Frank Schatz, Kornwestheim (DE); Paul Farber, Budapest (HU); Stefan Weiss, Tuebingen (DE); Gerhard Lammel, Tuebingen (DE); Fouad Bennini, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 62 days.

(21) Appl. No.: 14/005,983

(22) PCT Filed: Feb. 23, 2012

(86) PCT No.: PCT/EP2012/053037
§ 371 (c)(1),
(2), (4) Date: Nov. 21, 2013

(87) PCT Pub. No.: WO2012/126693
PCT Pub. Date: Sep. 27, 2012

(65) Prior Publication Data
US 2014/0077796 A1 Mar. 20, 2014

(30) Foreign Application Priority Data
Mar. 18, 2011 (DE) .......... 10 2011 005 764

(51) Int. Cl.
*G01R 33/18* (2006.01)
*G01R 33/04* (2006.01)
*G01R 33/02* (2006.01)
(Continued)

(52) U.S. Cl.
CPC .............. *G01R 33/02* (2013.01); *G01R 15/148* (2013.01); *G01R 33/04* (2013.01); *G01R 33/05* (2013.01); *G01R 33/18* (2013.01)

(58) Field of Classification Search
CPC ............................ G01R 33/093; G01R 33/04
USPC .................. 324/249, 253, 258, 260
See application file for complete search history.

(56) References Cited

U.S. PATENT DOCUMENTS

2008/0316647 A1 12/2008 Joisten et al.
2009/0243609 A1 10/2009 Hasunuma

FOREIGN PATENT DOCUMENTS

| CN | 1819027 A | 8/2006 |
|---|---|---|
| CN | 102147451 A | 8/2011 |
| DE | 102009001617 A1 | 9/2010 |

(Continued)

OTHER PUBLICATIONS

Zorlu et al., "An Orthogonal Fluxgate-Type Magnetic Microsensor With Electroplated Permalloy Core", Sensor & Actuators A, Elsevier Sequoia S.A., Lausanne, CH, vol. 135, No. 1, 2008, pp. 43-49, XP005928244. (Complete article).

(Continued)

*Primary Examiner* — Reena Aurora
(74) *Attorney, Agent, or Firm* — Kenyon & Kenyon LLP

(57) ABSTRACT

An apparatus for measuring a magnetic field is described, which comprises a core and an exciter coil for remagnetizing the core material. The remagnetizable core material is embodied as a layer or as multiple layers disposed at a distance from one another, and the core has a maximum total extension G where 2.5 mm≥G≥0.2 mm, a ratio of length to width that is greater than or equal to a value of twenty, and a thickness D where 2 μm≥D≥0.2 μm. Also described is a corresponding method for measuring a magnetic field.

15 Claims, 1 Drawing Sheet

(51) Int. Cl.
*G01R 15/14* (2006.01)
*G01R 33/05* (2006.01)

(56) References Cited

FOREIGN PATENT DOCUMENTS

| JP | 09145375 A | 6/1997 |
| JP | 2000292506 | 10/2000 |
| JP | 3295482 B2 | 6/2002 |
| JP | 2009519452 | 5/2009 |
| TW | 414027 U1 | 10/2011 |
| WO | 0055617 A1 | 9/2000 |
| WO | WO2007116583 | 10/2007 |

OTHER PUBLICATIONS

Kawahito et al., "A Fluxgate Magnetic Sensor With Micro-solenoids and Electroplated Permalloy Cores", Sensor & Actuators A, Elsevier Sequoia S.A., Lausanne, CH, vol. 43, No. 1-3, 1194, pp. 128-134, XP026615721. (Complete article).

International Search Report for PCT/EP2012/053037, issued on May 7, 2012.

Zorlu et al., "An Orthogonal Fluxgate-Type Magnetic Microsensor With Electroplated Permalloy Core", Sensor & Actuators A, Elsevier Sequoia S.A., Lausanne, CH, vol. 135, No. 1, 2008, pp. 43-49, XP005928244.

Kawahito et al., "A Fluxgate Magnetic Sensor With Micro-solenoids and Electroplated Permalloy Cores", Sensor & Actuators A, Elsevier Sequoia S.A., Lausanne, CH, vol. 43, No. 1-3, 1194, pp. 128-134, XP026615721.

APPARATUS AND METHOD FOR MEASURING MAGNETIC FIELDS

FIELD OF THE INVENTION

The present invention relates to an apparatus for measuring a magnetic field, having a core that has remagnetizable core material and an exciter coil for remagnetizing the core material. The invention further relates to a corresponding method for measuring a magnetic field.

BACKGROUND INFORMATION

There are a variety of apparatuses for determining and measuring magnetic fields. These are, among others, Hall sensors, anisotropic magnetoresistance (AMR) sensors, field plates, field coils, fluxgate sensors, giant magnetoresistance (GMR) sensors, tunnel magnetoresistance (TMR) sensors, and superconducting quantum interference devices (SQUIDs).

One very simple principle, based on a coil and a soft magnetic core, is the fluxgate sensor. The measurement principle is based on remagnetization of a soft magnetic core with the aid of an exciter coil, and detection, using a measurement coil (pickup coil), of the time-dependent flux thereby generated. The change in flux is determined by the magnetization curve of the soft magnetic core as a function of the external field. The more quickly the remagnetization occurs, the greater the voltage in the pickup coil. The voltage elevation can be generated both by a steeper magnetization hysteresis (greater permeability) and by an increase in the frequency of the exciter coil.

An evaluation method that is often used is measurement of the second harmonic component of the signal in the pickup coil. This component corresponds substantially to the nonlinear portion of the transfer function that is attributable to saturation of the core. The amplitude of the second harmonic component is proportional to the external field.

One such method is described, for example, in Drljaca, P. M. et al., "Low-Power 2-D Fully Integrated CMOS Fluxgate Magnetometer," IEEE Sensor Journal, Vol. 5, Issue 5, pp. 909-915 (2005). The dimensions of the fluxgate cores here are: length 1400 µm, width 20 µm, and thickness 7 µm. In this method, the signal shape is broken down into its Fourier components in order to separate the second harmonic component dependent on the external field. It is important here that the amplitude of the second harmonic be appreciably greater than the system noise. This amplitude decreases with the volume of core material, however, and the possibility for miniaturization is therefore limited.

Another measurement method known in the literature (Walter Heinecke, PhD thesis: "Measurement of magnetic fields and field differences using saturation core probes with the direct time coding method," Braunschweig, 1975) is to measure the point in time of remagnetization on the basis of the voltage swing of the voltage induced in a pickup coil. This point in time depends on the external field and is thus an indication of the field to be measured.

For accurate measurement of this point in time, it is necessary that the voltage pulse resulting from remagnetization have a rise time that is as steep as possible. An increase in frequency is not helpful, since the rise time then becomes narrower, but the offset width becomes less to the same extent, so that no improvement in resolution can be achieved. All that remains is to make the magnetization hysteresis as steep as possible by appropriately selecting the material and the manufacturing process.

For miniaturized fluxgate sensors there are limits to the optimization of the material and process because the boundary conditions of the MEMS manufacturing process allow little variation. In addition, because of the demagnetization factor, short fluxgate cores exhibit flatter hysteresis curves than non-miniaturized fluxgates of the same material. The miniaturization of the coils and of the coil core also causes the signal at the pickup coils to increasingly small (for the same magnetization hysteresis), so that evaluation becomes increasingly difficult.

SUMMARY

The object of the invention is to make available a measurement apparatus and a corresponding measurement method that make it possible to measure very small magnetic fields with little space requirement.

The core material of the apparatus according to the present invention is embodied as a layer or as multiple layers disposed at a distance from one another. The core has (a) a maximum total extension G where 2.5 mm≥G≥0.2 mm, (b) a thickness D where 2 µm≥D≥0.2 µm, and (c) a ratio of length to width that is greater than or equal to a value of twenty. These dimensions yield a core whose at least one layer is embodied as a magnetically anisotropic layer. This magnetically anisotropic layer preferably exhibits two-fold symmetry (180° symmetry) in terms of magnetization. This apparatus is referred to hereinafter as a "flip-core sensor."

This kind of configuration of the core material has the advantage that remagnetization is accomplished by displacing at least one Bloch wall. Because Bloch wall displacements take place at a speed of approximately 100 m/s, a displacement of a Bloch wall in a core material having a layer width of approximately 50 µm can occur in less than 0.5 µs. This has the advantage that a signal can be achieved which is greater by a factor of 10 than with a fluxgate magnetometer based on Weiss domain polarity reversal. Because the change in magnetization depends substantially on the displacement speed of the Bloch walls, the change in the magnetization of the core material of the apparatus according to the present invention is moreover advantageously at least substantially independent of the frequency of the alternating current flowing through the exciter coil. A further advantage of the apparatus according to the present invention is that the apparatus can be more greatly miniaturized, since the signal of the apparatus according to the present invention turns out to be greater.

The essence of the invention is therefore to optimize the dimensions of core 10 in such a way that remagnetization occurs in a time that is shorter than the time required to cycle through the magnetization curve. The entire remagnetization operation then proceeds in one step at the speed of the domain wall motion.

The duration of the remagnetization process can thereby be kept below 500 ns, with the result that good time resolution of the compensation point is achieved. The associated excitation current can thereby be readily determined.

The apparatus according to the present invention can therefore advantageously be integrated into a microchip, for example into a microelectromechanical system (MEMS). "Microelectromechanical systems" are understood here in particular both as microelectromechanical systems (MEMS) and as smaller electromechanical systems such as nanoelectromechanical systems (NEMS). The Weiss domains preferably extend over the thickness of the layer or layers.

Provision is made in particular that the thickness D of the core is in the range of 1 µm≥D≥0.2 µm.

According to a preferred embodiment of the invention, provision is made that the core has a ratio of length to width that is greater than or equal to a value of twenty-five.

According to a preferred embodiment of the invention, provision is made that the core material has a permeability index $\mu_r$ greater than or equal to five thousand (5,000), in particular greater than or equal to ten thousand (10,000).

According to a preferred embodiment of the invention, provision is made that the core material of the core is a soft magnetic material. In particular, the core material of the core is a nickel-iron alloy (NiFe or mu-metal (μ-metal, or "permalloy")). Mu-metal is a soft magnetic nickel-iron alloy (approx. 75-80% nickel) of very high magnetic permeability (permeability index $\mu_r$=50,000 to 140,000) that is used, for example, for shielding of low-frequency magnetic fields and for the manufacture of ferromagnetic cores of signal transmitters, magnetic current sensors, and current transformers.

According to a further preferred embodiment of the invention, provision is made that a non-magnetic intermediate layer is respectively disposed between the layers of remagnetizable core material. The intermediate layers are preferably so thin that crystallization is avoided, without disrupting the exchange interaction between the layers of remagnetizable core material. Particularly preferably, the non-magnetic intermediate layer(s) is/are between one nanometer (1 nm) and three nanometers (3 nm) thick.

Provision is further made that the thickness of each individual one of the layers of remagnetizable core material of a core having multiple layers disposed at a distance from one another has a layer thickness $D_S$ where 60 nm≥$D_S$≥20 nm.

According to a further preferred embodiment of the invention, provision is made that the apparatus has a device for detecting the remagnetization process. This device can detect a remagnetization, for example, by way of magnetooptical effects or by way of resulting leakage fields. The device is, for example, a device for ascertaining the magnetization state of the core material.

A further subject of the present invention is a microelectromechanical system that encompasses an apparatus according to the present invention.

A further subject of the present invention is a method for measuring a magnetic field by way of an aforesaid apparatus. In the context of the method according to the present invention, an alternating current flows through the exciter coil for periodic remagnetization of the core material accompanied by formation of a periodically changing magnetic field, with the result that the core material becomes periodically remagnetized. The magnetic field to be measured, and the magnetic field of the exciter coil, are superimposed in this context. The magnetic field to be measured is deduced from a time shift of the remagnetization of the core material with respect to the zero crossing of the alternating current.

In a further embodiment of the invention, the apparatus has a device for detecting the remagnetization process. Here the point in time of remagnetization is determined by way of a signal based on Bloch wall displacement, in particular on the displacement of a single Bloch wall. This is advantageous because the displacement of a Bloch wall as a rule proceeds more quickly than the remagnetization of the Weiss domains, with the result that a stronger signal is generated and thus a more accurate indication of the point in time of remagnetization can be given.

According to a further preferred embodiment of the invention, provision is made that the device has a measurement coil for measuring a magnetic field change brought about by the core material, the point in time of remagnetization being determined by a voltage change induced in the measurement coil. The point in time of remagnetization can be determined in particular by way of a voltage pulse induced in the measurement coil and based on Bloch wall displacement, in particular on the displacement of a single Bloch wall. This is advantageous because the displacement of a Bloch wall as a rule proceeds more quickly than the remagnetization of the Weiss domains, with the result that a stronger signal is generated and thus a more accurate indication of the point in time of remagnetization can be given.

DETAILED DESCRIPTION

Figure 1:
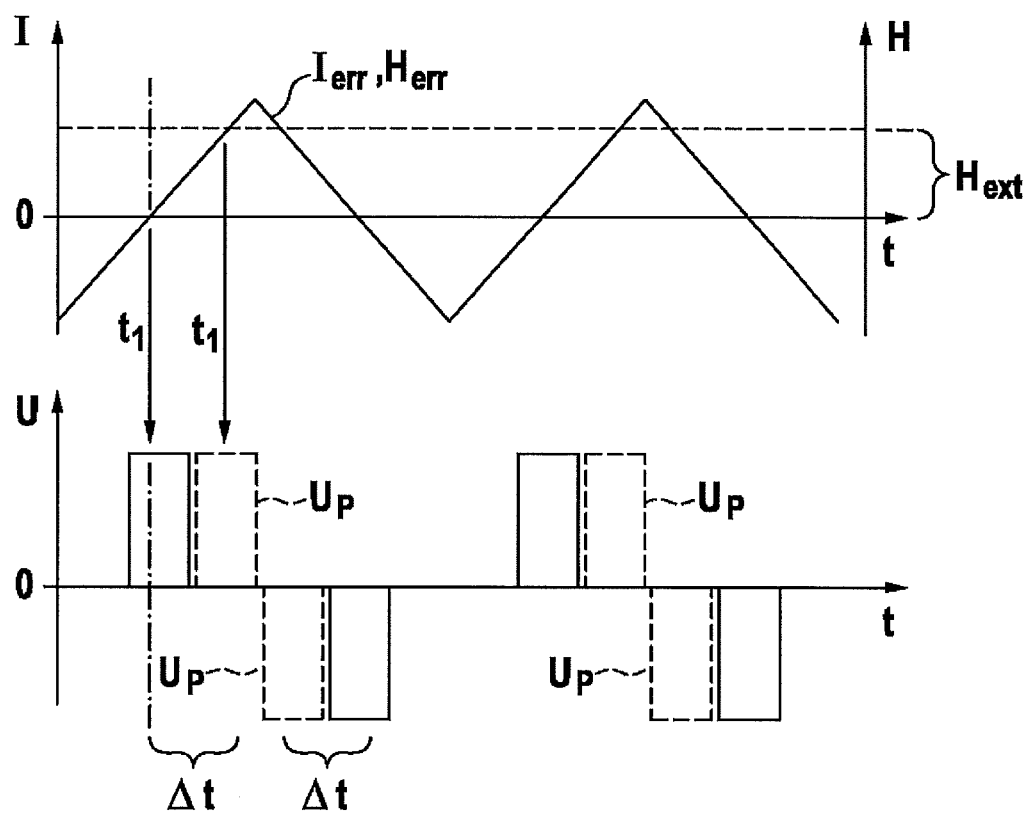
FIG. 1 shows two corresponding graphs to illustrate the measurement principle.

The apparatus for measuring a magnetic field has, in an embodiment not shown here, a core 10 (shown in FIG. 2) that encompasses remagnetizable core material in the form of at least one layer, an exciter coil for remagnetizing the layers of core 10, and a device for time-dependent detection of this remagnetization process. This device has a measurement coil for measuring a magnetic field change brought about by the remagnetizable core material. FIG. 1 shows two corresponding graphs to illustrate the measurement principle. The top graph shows an alternating current $I_{err}$ through the exciter coil, plotted against time t. This alternating current is directly proportional to a magnetic field strength H. Alternating current $I_{err}$ results from an alternating voltage that is applied to the exciter coil and is embodied in the example shown as a triangular voltage. The magnetic field strength $H_{ext}$ of the external magnetic field to be measured is also plotted.

The bottom graph in FIG. 1 shows the resulting voltage U over time t that can be picked off at the measurement coil of the apparatus. This voltage takes the form of voltage pulses $U_p$ (depicted schematically here).

Figure 2:
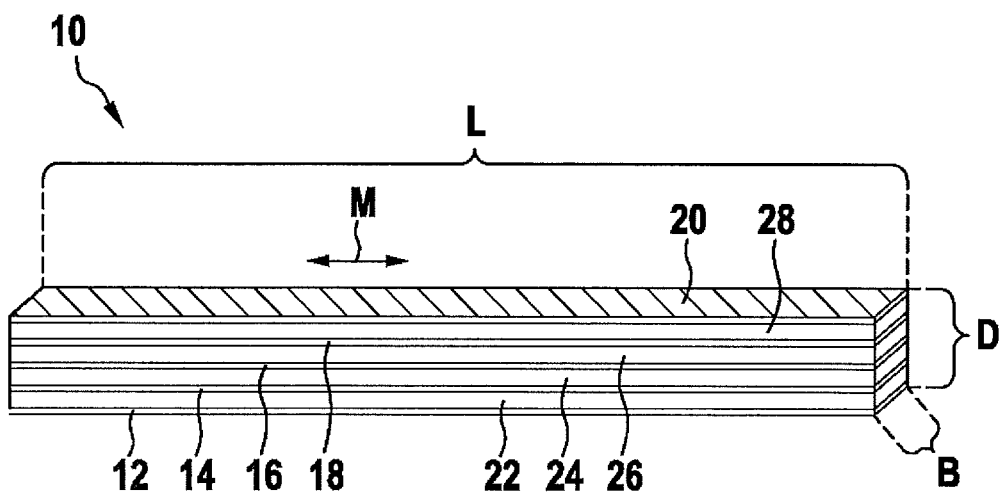
FIG. 2 shows a core of an apparatus for measuring a magnetic field.

FIG. 2 shows core 10 of an apparatus for measuring a magnetic field. Core 10 has several (here, five) layers 12, 14, 16, 18, 20 disposed in plane-parallel fashion at a distance from one another and made of remagnetizable core material, and non-magnetic intermediate layers 22, 24, 26, 28, disposed between each two adjacent layers 12, 14, 16, 18, 20. Core 10 has a maximum total extension G that is somewhat greater than G=1.5 mm, a ratio of length L to width B that is equal to a value of twenty-four (L*B=24), and a thickness D that is equal to 0.26 μm. The length L of each of the layers made of remagnetizable material is 1200 μm, the width B of each of the layers is 50 μm. The thickness $D_S$ of each of the layers 12, 14, 16, 18, 20 of remagnetizable material is 50 nm.

The remagnetizable core material is a soft magnetic nickel-iron alloy having high permeability (permeability index $\mu_r$, for example, 100,000) and low magnetostriction. As a result of the geometry selected for layers 12, 14, 16, 18, 20 and an appropriately selected substrate (not shown), the remagnetizable layers are embodied as magnetically anisotropic layers that exhibit a two-fold symmetry (180° symmetry) in terms of magnetization directions (double arrow M in FIG. 2). This symmetry is oriented in parallel fashion for all layers 12, 14, 16, 18, 20 of remagnetizable core material.

The resulting functionality is as follows: In the context of the measurement method according to the present invention, an alternating current $I_{err}$ flows through the exciter coil accompanied by formation of a periodically changing magnetic field $H_{err}$, with the result that the core material in layers 12, 14, 16, 18, 20 becomes periodically remagnetized. The magnetic field $H_{ext}$ to be measured, and the magnetic field $H_{err}$ of the exciter coil, are superimposed in this context. The magnetic field $H_{ext}$ to be measured is deduced from a time shift of the remagnetization of the core material with respect to the zero crossing of the alternating current ($\Delta t$). For this purpose, the point in time of remagnetization is determined by a voltage change induced in the measurement coil. The point in time of remagnetization can be determined in particular by way of a voltage pulse induced in the measurement coil and based on Bloch wall displacement, in particular on the displacement of a single Bloch wall. This is advantageous because the displacement of a Bloch wall as a rule proceeds more quickly than the remagnetization of the Weiss domains, with the result that a stronger signal is generated and thus a more accurate indication of the point in time of remagnetization can be given.

The use of a highly permeable soft magnetic core material, and the particularly selected geometry of the layer(s), result in very narrow voltage pulses that permit a precise determination of the external magnetic field. The exciter coil is dimensioned so that it can drive the remagnetizable core material into saturation magnetization +/–$M_s$, in the predefined measurement range, for both magnetization directions (proceeding antiparallel to one another). This saturation magnetization is equal to a flux density of 0.7 to 0.8 T for permalloy. For the flip-core method, however, a material having a higher or lower saturation magnetization can also be used.

The apparatus is therefore also referred to as a "flip-core" (magnetic field) sensor. The basic principle of this flip-core sensor (whose construction is moreover just as simple as that of a fluxgate sensor) is to compensate by way of the exciter coil for the external magnetic field $H_{ext}$ that is to be measured, while the core always abruptly remagnetizes (flips) at the field zero crossing and thus indicates the field zero crossing. The abrupt remagnetization can easily be detected using a measurement coil (pickup coil) or a simple magnetic field sensor, since the magnetization swing from +$M_s$ (saturation magnetization) to –$M_s$ is readily detectable. The current $I_{err}$ needed in order to compensate for the external field $H_{err}$ is then an indication of the external magnetic field $H_{ext}$.

An advantage as compared with a fluxgate sensor is that this sensor can readily be miniaturized. Miniaturization is in fact compatible with the flip principle. Magnetic material having dimensions in the μm range or larger as a rule always exhibits a plurality of domains. Because the various domains never remagnetize simultaneously, the remagnetization duration is correspondingly long. To enable an abrupt remagnetization, on the one hand a high-permeability magnetic layer is used, for example NiFe, possibly also constructed from multiple layers 12, 14, 16, 18, 20 optionally having non-magnetic intermediate layers 22, 24, 26, 28. The remagnetizable layers should not be too thick so as not to allow multiple domains above one another (thickness less than or equal to 2 μm, or thickness less than or equal to 1 μm). In addition, the width of core 10 as a function of length should not exceed a specific dimension, since otherwise the inherent leakage field stops remagnetization before the entire strip is remagnetized. For a core length of 1600 μm to 2000 μm the width should preferably be ≤80 μm; for a core length of 1000 μm to 1600 μm the width should preferably be ≤50 μm; for a core length of 700 μm to 1000 μm preferably ≤35 μm. For core lengths below 700 μm, the width is preferably limited to less than 22 μm.

Thanks to this geometric stipulation, the remagnetization process is achieved substantially with one domain jump (the range particularly preferred for the present application is 700 μm to 1600 μm). To ensure that the remagnetization process or operation is not disrupted by other processes, the material should in particular be highly permeable.

What is claimed is:

1. An apparatus for measuring a magnetic field, comprising:
   a core including a remagnetizable core material and an exciter coil for remagnetizing the remagnetizable core material, wherein:
      the remagnetizable core material includes multiple layers of the remagnetizable core material disposed at a distance from one another;
      a ratio of length to width of the core is greater than or equal to a value of twenty;
      a thickness of the core is D;
      2 μm≥D≥0.2 μm;
      a thickness of each individual one of the layers is $D_S$; and
      60 nm≥$D_S$≥20 nm.

2. The apparatus as recited in claim 1, wherein the remagnetizable core material has a permeability index greater than or equal to two thousand.

3. The apparatus as recited in claim 1, wherein the remagnetizable core material has a permeability index greater than or equal to ten thousand.

4. The apparatus as recited in claim 1, wherein the remagnetizable core material is a soft magnetic material.

5. The apparatus as recited in claim 1, wherein the remagnetizable core material is a nickel-iron alloy.

6. The apparatus as recited in claim 1, further comprising:
   a plurality of non-magnetic intermediate layers, each non-magnetic intermediate layer being respectively disposed between respective pairs of the layers of the remagnetizable core material.

7. The apparatus as recited in claim 1, further comprising:
   a device for detecting a remagnetization process.

8. The apparatus as recited in claim 1, wherein a maximum total extension of the core is G, and 2.5 mm≥G≥0.2 mm.

9. A microelectromechanical system, comprising:
   an apparatus for measuring a magnetic field, the apparatus comprising a core that includes a remagnetizable core material and an exciter coil for remagnetizing the remagnetizable core material, wherein:
      the remagnetizable core material includes multiple layers of the remagnetizable core material disposed at a distance from one another;
      a ratio of length to width of the core is greater than or equal to a value of twenty;
      a thickness of the core is D;
      2 μm≥D≥0.2 μm;
      a thickness of each individual one of the layers is $D_S$; and
      60 nm≥$D_S$≥20 nm.

10. The system as recited in claim 9, wherein a maximum total extension of the core is G, and 2.5 mm≥G≥0.2 mm.

11. A method for measuring a magnetic field using an apparatus that includes a core, wherein the core includes a remagnetizable core material and an exciter coil for remagnetizing the remagnetizable core material, the remagnetizable core material includes multiple layers of the remagnetizable core material disposed at a distance from one another, a ratio of length to width of the core is greater than or equal to a value of twenty, a thickness of the core is D, 2 μm≥D≥0.2 μm, a thickness of each individual one of the layers is $D_S$, and 60 nm≥$D_S$≥20 nm, the method comprising:
   providing an alternating current flowing through the exciter coil for a periodic remagnetization of the remagnetizable core material accompanied by formation of a periodically changing magnetic field;

superimposing a magnetic field to be measured and the magnetic field of the exciter coil; and deducing the magnetic field to be measured from a time shift of a remagnetization of the remagnetizable core material with respect to a zero crossing of the alternating current.

12. The method as recited in claim 11, wherein the apparatus includes a device for detecting the remagnetization process.

13. The method as recited in claim 12, wherein the device includes a measurement coil for measuring a magnetic field change brought about by the remagnetizable core material, a point in time of remagnetization being determined by a voltage change induced in the measurement coil.

14. The method as recited in claim 13, wherein the voltage change includes a voltage pulse.

15. The method as recited in claim 11, wherein a maximum total extension of the core is G, and 2.5 mm≥G≥0.2 mm.

* * * * *